United States Patent
Huang

(10) Patent No.: US 7,104,827 B1
(45) Date of Patent: Sep. 12, 2006

(54) CPU SOCKET WITH MULTIPLE CONTACTING TAB HOLDERS

(76) Inventor: Huang-Chou Huang, No. 377, Fu-Teh First Rd., Hsi-Chih, Taipei Hsien (TW)

( * ) Notice: Subject to any disclaimer, the term of this patent is extended or adjusted under 35 U.S.C. 154(b) by 0 days.

(21) Appl. No.: 11/297,444

(22) Filed: Dec. 9, 2005

(51) Int. Cl.
*H01R 13/62* (2006.01)

(52) U.S. Cl. ......................................... 439/331; 439/70
(58) Field of Classification Search ................ 439/331, 439/330, 525, 526, 66, 69, 70
See application file for complete search history.

(56) References Cited

U.S. PATENT DOCUMENTS

| | | | | |
|---|---|---|---|---|
| 5,829,988 | A * | 11/1998 | McMillan et al. | 439/70 |
| 6,971,902 | B1 * | 12/2005 | Taylor et al. | 439/342 |
| 7,014,477 | B1 * | 3/2006 | Tsai | 439/71 |
| 2004/0147152 | A1 * | 7/2004 | Okita et al. | 439/331 |
| 2005/0020117 | A1 * | 1/2005 | Motohashi | 439/331 |

* cited by examiner

*Primary Examiner*—Hien Vu
(74) *Attorney, Agent, or Firm*—Hershkovitz & Associates; Abe Hershkovitz

(57) ABSTRACT

A center processing unit (CPU) socket holds a CPU and has a base, multiple contacting tabs and multiple contacting tab holders. The base has a bottom, a seat, a cover and a latch. The seat is mounted in the bottom and has a recess. The contacting tabs are mounted in the recess in multiple lines and each contacting tab has a curved top contact end. The contacting tab holders extend up from the recess in seat and are aligned respectively with the curved top contact ends of the contacting tabs. When a CPU is installed in the CPU socket and presses against the contacting tabs, the contacting tab holders hold the curved top contact ends of the contacting tabs to avoid the vibration of the contacting tabs due to the transmission of the high frequency signals between the CPU and the CPU socket.

4 Claims, 4 Drawing Sheets

CPU SOCKET WITH MULTIPLE CONTACTING TAB HOLDERS

BACKGROUND OF THE INVENTION

1. Field of the Invention

The present invention relates to a central processing unit (CPU) socket, and more particularly to a CPU socket that has multiple contacting tabs and multiple contacting tab holders holding and improving the quality of signal transmission between the socket and a CPU installed in the socket.

2. Description of Related Art

Center processing unit (CPU) sockets are mounted on motherboards and hold CPUs for execution of programs.

The new Pentium 4 (P4) CPU and LGA775 socket for holding the P4 CPU designed by Intel Corp.® are available and prevail this year. The P4 CPU has a bottom and multiple contacts mounted on the bottom. The LGA775 socket has a cavity to hold the P4 CPU and multiple contacting tabs in the cavity corresponding to and making contact with the contacts on the P4 CPU. The cavity has a bottom. The contacting tabs are resilient, extend upward from the bottom and are bent downward when the P4 CPU is installed into the socket and presses against the contacts. When the P4 CPU is removed, the contacting tabs reset with a resilient force.

With reference to FIG. 4, a conventional CPU socket (2) includes a body (20), a cavity (27) for receiving a CPU, multiple retaining blocks (25) and multiple resilient contacting tabs (120) for contacting contacts of the CPU. The contacts (120) are mounted respectively to the retaining blocks (25) at intervals (25). Each contact (120) has a contacting end. When the CPU operates with the contacts contacting the contacting ends of the contacting tabs (120) in the socket, high frequency signals transmitted from the CPU to the contacting tabs (120) make the contacting ends resonate and vibrate. The vibration of the contacting ends causes the contact between the CPU and the socket unstable and lowers diminish the quality of signal transmission.

To overcome the shortcomings, the present invention provides a CPU socket with a cushion to mitigate or obviate the aforementioned problems.

SUMMARY OF THE INVENTION

The main objective of the invention is to provide a center processing unit (CPU) socket that has multiple contacting tabs and multiple contacting tab holders holding and improving the quality of signal transmission between the socket and a CPU installed in the socket.

A CPU socket in accordance with the present invention holds a CPU and has a base, multiple contacting tabs and multiple contacting tab holders.

The base has a bottom, a seat, a cover and a latch. The seat is mounted in the bottom and has a recess.

The contacting tabs are mounted in the recess in multiple lines and each contacting tab has a curved top contact end.

The contacting tab holders extend up from the recess in seat and are aligned respectively with the curved top contact ends of the contacting tabs.

Other objectives, advantages and novel features of the invention will become more apparent from the following detailed description when taken in conjunction with the accompanying drawings.

DETAILED DESCRIPTION OF PREFERRED EMBODIMENT

Figure 1:
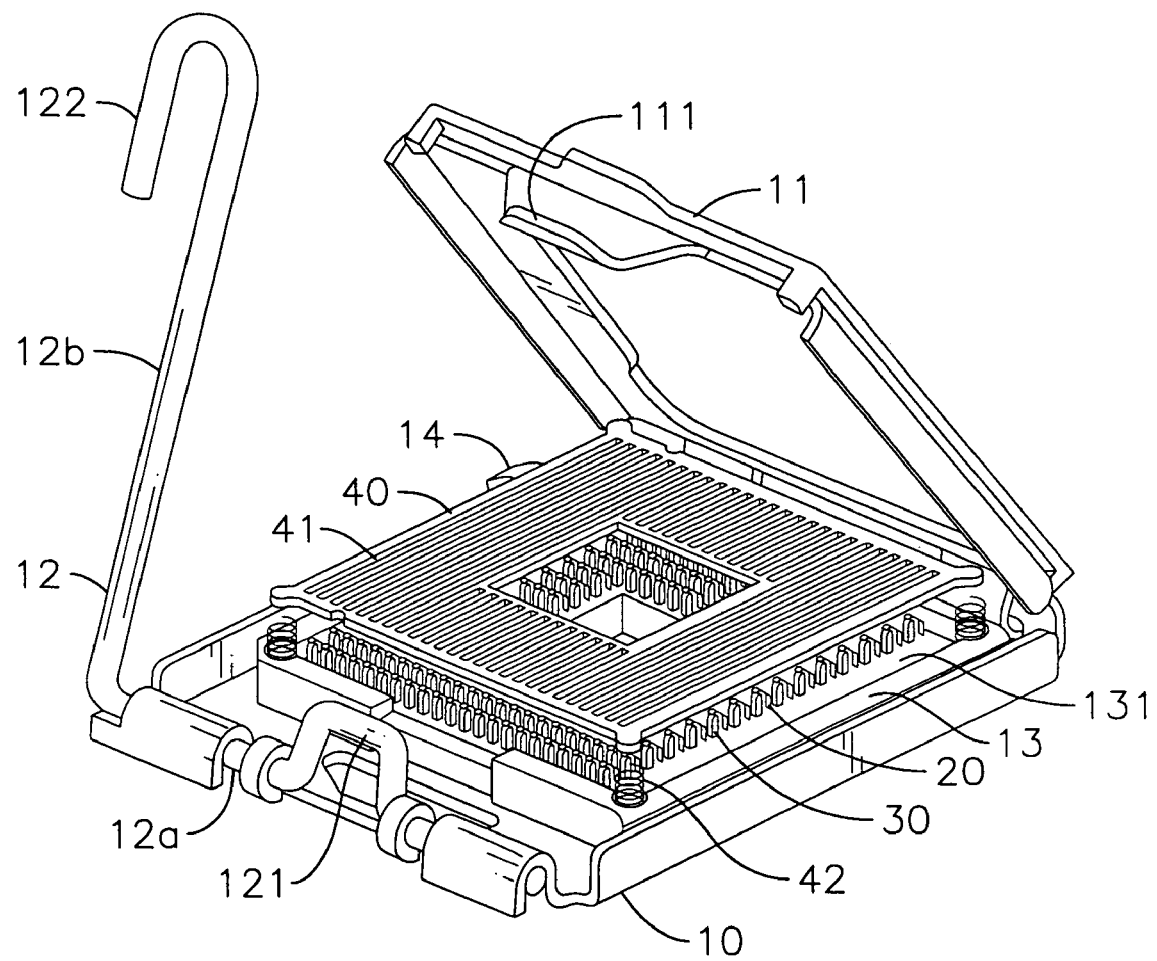
FIG. 1 is an exploded perspective view of a center processing unit (CPU) socket with multiple contacting tab holders in accordance with the present invention.
Figure 2:
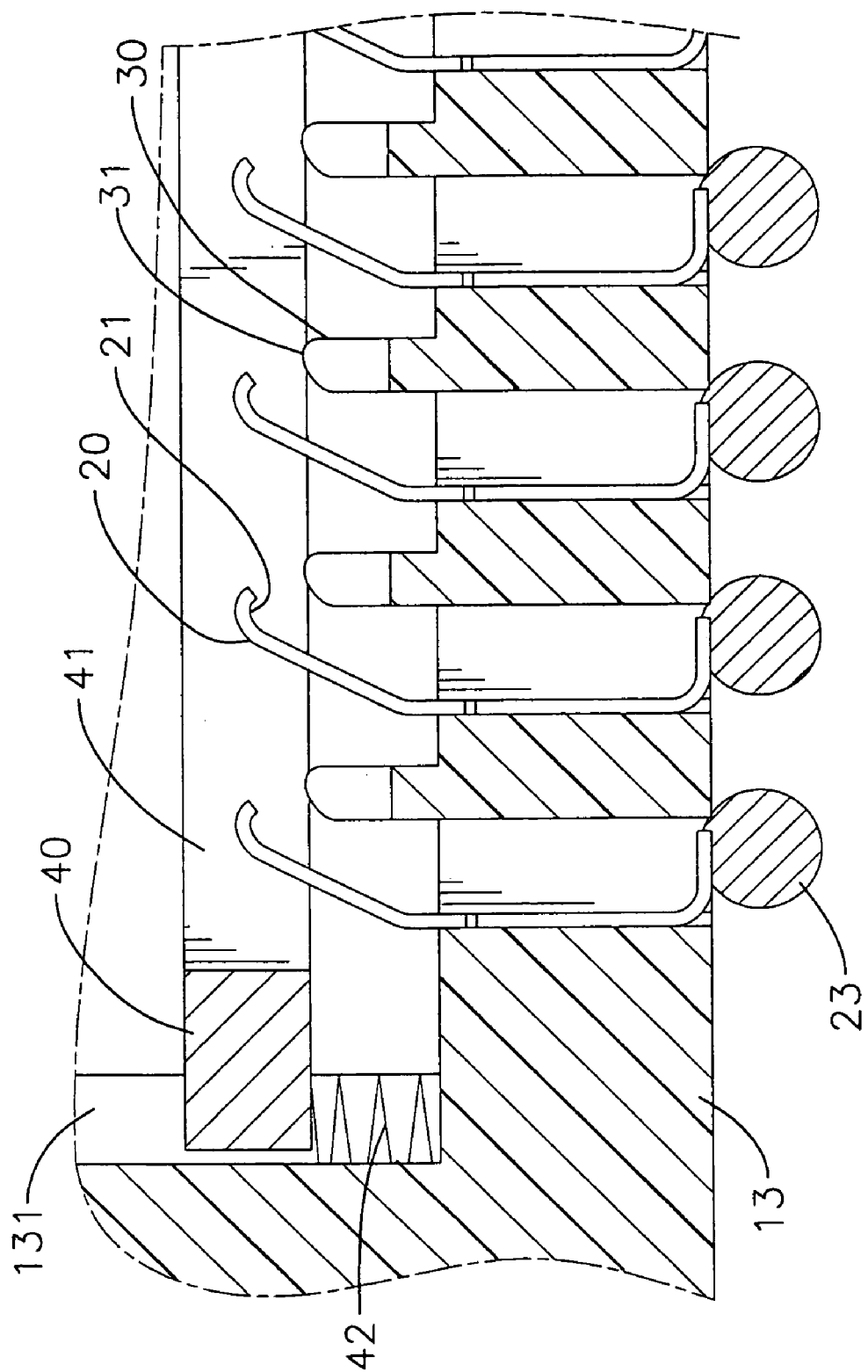
FIG. 2 is a side view in partial section of the CPU socket in FIG. 1.
Figure 3:
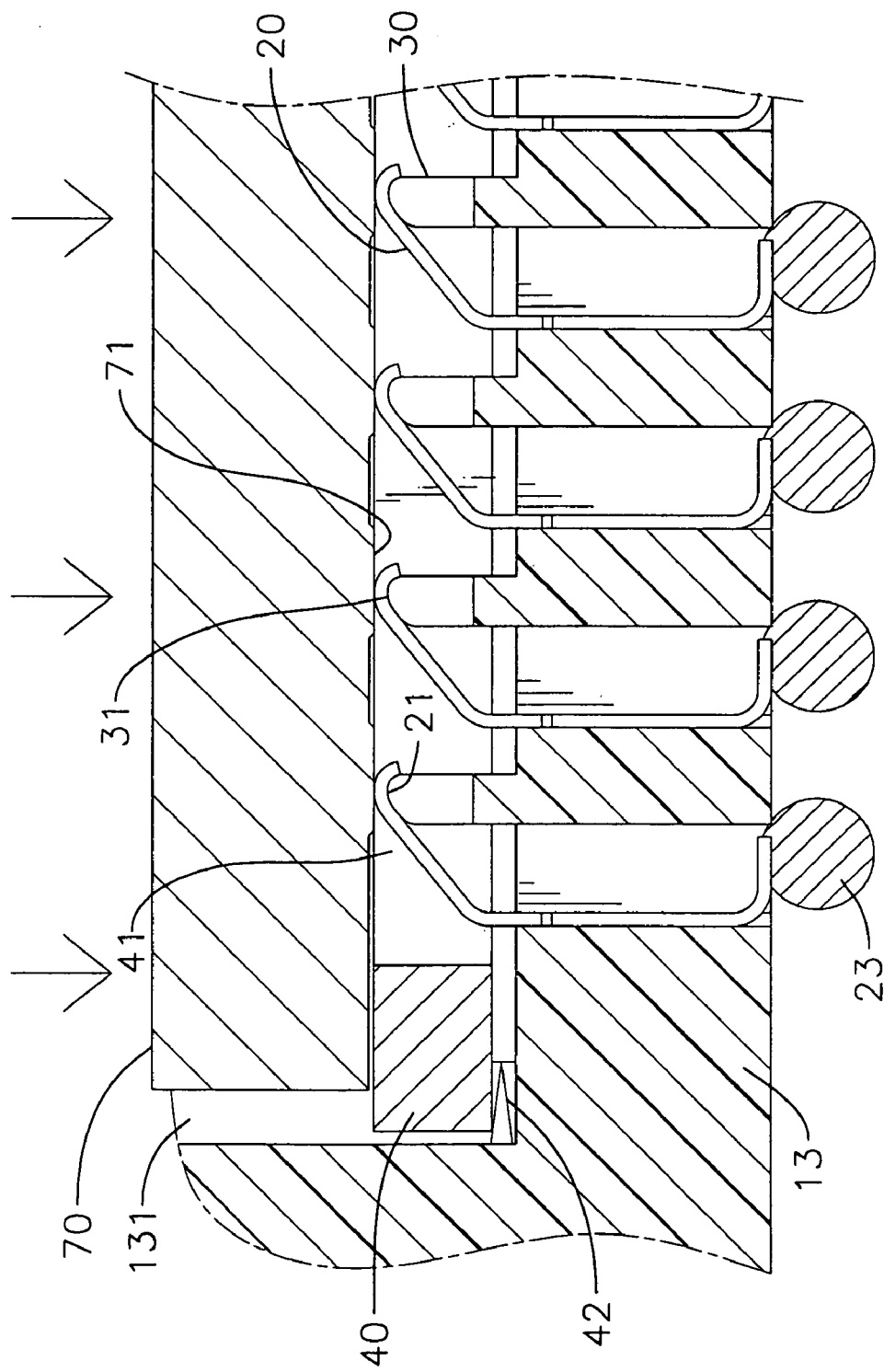
FIG. 3 is a side view in partial section of the CPU socket with the contacting tabs pressed against the installed CPU and respectively held by holders in FIG. 2.
Figure 4:
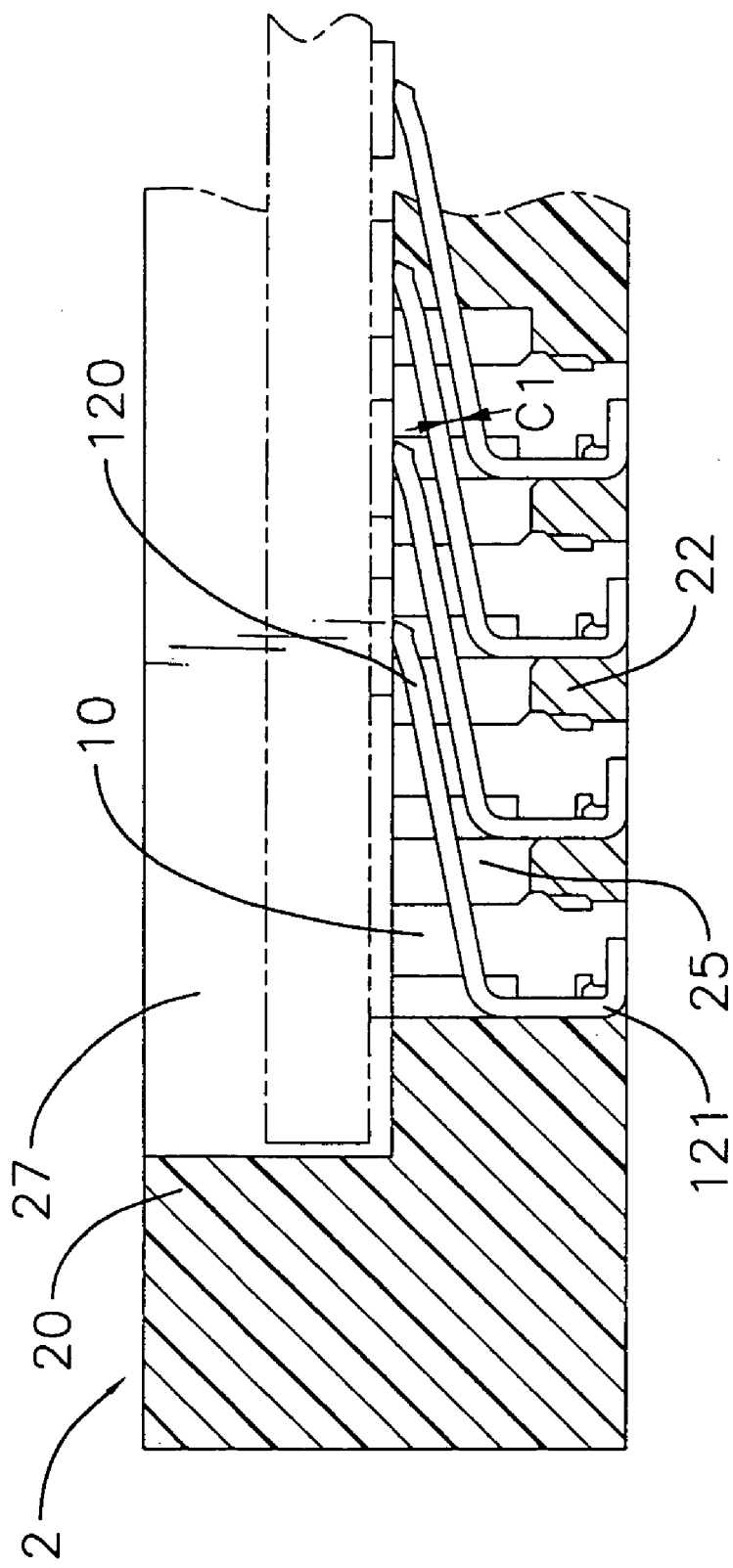
FIG. 4 is a side view in partial section of a conventional CPU socket with multiple contacting tabs in accordance with the prior art of U.S. Pat. No. 6,805,561.

With reference to FIGS. 1 and 3, a center processing unit (CPU) socket in accordance with the present invention is mounted on a motherboard (not shown) to hold a CPU (70). The CPU (70) has a bottom and multiple contacts (71) on the bottom.

The CPU socket has a base (10), multiple contacting tabs (20), multiple contacting tab holders (30) and a cushion.

The base (10) has a top, a bottom, a front, a rear, an outer edge, a cavity, a catch (14), a seat (13), a cover (11) and a latch (12).

The cavity is defined through the top and the bottom of the base (10).

The catch (14) extends from the outer edge of the base (10).

The seat (13) is mounted in the cavity in the base (10) and has a top, a bottom, a recess (131) and multiple mounting holes. The bottom of the seat (13) extends out from the bottom of the base (10). The recess (131) is defined in the top of the seat (13) and has multiple spring slots. The spring slots are defined in the top of the seat (13) and communicate with the recess (131). The mounting holes are defined through the bottom of the seat (13) in multiple lines.

The cover (11) is mounted pivotally on the base (10) and has a front, a rear and a latch tab (111). The rear of the cover (11) is mounted pivotally on the rear of the base (10). The latch tab (111) is formed on the front of the cover (11).

The latch (12) is L-shaped, is mounted pivotally on the base (10) and has a locking arm and a lever. The locking arm is mounted pivotally on the front of the base (10) and has two ends and a locking tab (121). The locking tab (121) may be a U-shaped, is formed in the locking tab (121) and selectively engages the latch tab (111) on the cover (11). The lever perpendicularly extends from one end of the locking arm, selectively engages the catch (14) on the base (10) and has a distal end and a grip (122). The grip (122) is formed on the distal end of the lever so the latch (12) can be operated easily with the grip (122).

The contacting tabs (20) are mounted respectively through the mounting holes in the seat (13) and are aligned respectively with the contacts (71) on the bottom of the CPU (70). Each contacting tab (20) has a curved top contact end (21), a bottom end and a solder ball (23). The curved top contact end (21) makes contact with a corresponding contact (71) on the CPU (70) in the CPU socket. The solder balls (23) are attached respectively to the bottom ends of the contacting tabs (14) to respectively attach contacting tabs (14) on the motherboard to mount the CPU socket on the motherboard.

The contacting tab holders (30) are formed on the seat (13), extend up from the recess in seat (13) and are aligned respectively with the curved top contact ends (21) of the contacting tabs (40). Each contacting tab holder (30) has a curved top surface (31) corresponding to the curved top contact end (21) of a corresponding contacting tab (40). When the CPU (70) is installed in the CPU socket and has the contacts (71) respectively contact the contacting tabs (40), the curved top contact ends (21) of the contacting tabs (40) are pressed downward and held securely by the curved top surfaces (31) of the contacting tab holders (30). The contacting tab holders (30) cooperates the bottom of the CPU (70) to hold the curved top contact ends (21) of the contacting tabs (40) from vibrating when high frequency signals are transmitted between the CPU (70) and the contacting tabs (40).

The cushion is mounted in the base (10) and has multiple springs (42) and a CPU backplate (40).

The springs (42) are mounted in the recess (131) in the seat (13) and may be mounted respectively in the spring slots in the recess (131). Each spring (42) has a bottom end and a top end. The bottom ends of the springs (42) are mounted on the bottom of the seat (13).

The CPU backplate (40) is mounted on the top ends of the springs (42) in the recess (131) in the seat (13), cooperates with the springs (21) to cushion the CPU (70) during installation in the CPU socket. The CPU backplate (40) has an outer edge, multiple slots (41) and multiple mounting tabs.

The slots (41) are defined through the CPU backplate (40) and are aligned respectively with the contacting tabs (40) in the seat (13). When the CPU (70) is installed in the CPU socket, the springs (42) cooperate with the CPU backplate (40) to oppose the force pushing the CPU (70) down and obviate any solid structure contact. Therefore, the contacting tabs (20) make contact respectively with the contacts (71) on the CPU (70) without deforming permanently or being damaged by the force pushing the CUP (70) into the CPU socket.

The mounting tabs extend from the outer edge of the CPU backplate (40) and are mounted respectively on the top ends of the springs (42).

With contacting tab holders (30) respectively holding the curved top contact ends (21) of the contacting tabs (20), the vibration of the contacting tabs (20) due to the transmission of high frequency signals between the CPU (70) and the CPU socket is avoided. Therefore, the quality of signal transmission is improved.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A central processing unit (CPU) socket comprising:
    a base having a top, a bottom, a front, a rear, an outer edge and having
        a cavity defined through the top and the bottom of the base;
        a catch extending from the outer edge of the base;
        a seat in the base and having
            a top portion;
            a bottom extending out from the bottom portion of the base;
            a recess defined in the top of the seat; and
            multiple mounting holes defined through the bottom of the seat in multiple lines;
        a cover mounted pivotally on the base and having
            a front portion;
            a rear portion mounted pivotally on the rear portion of the base; and
            a latch member tab formed on the front of the cover; and
        a latch mounted pivotally on the base and having
            a locking arm mounted pivotally on the front of the base and having two ends on the locking tab in between the two ends formed in the locking arm and selectively engaging the latch tab on the cover; and
            a lever extending from one end of the locking arm, selectively engaging the catch on the base and having a grip formed on a distal end of the lever;
    multiple elongated contacting tabs mounted respectively through the mounting holes in the seat, aligned respectively with the contacts on the bottom of the CPU and each contacting tab extending upwardly having a curved top contact end and a bottom end; and
    multiple contacting tab holders formed on the seat, and extending upwardly from the seat in the recess and aligned respectively below the contacts, the curved top contact ends of the contacting tabs and each contacting tab holder having a curved top surface corresponding to and securely holding the curved top contact end of a corresponding contacting tab when the contacting tab is pressed down toward the contacting tab holder by a CPU; and a CPU backplate mounted on the top ends of a cushion in the recess of the seat and having an outer edge and multiple slots defined through the CPU backplate and aligned respectively with the contacting tabs in the seat.

2. The CPU socket as claimed in claim 1, wherein the cushion mounted in the base and having
    multiple springs mounted in the recess in the seat and each spring having a bottom end mounted on the bottom of the seat.

3. The CPU socket as claimed in claim 2, wherein:
    the seat in the base further has multiple spring slots defined in the top of the seat and communicating with the recess;
    the springs are mounted respectively in the spring slots; and
    the CPU backplate further has multiple mounting tabs extending from the outer edge of the CPU backplate and mounting respectively on the top ends of the springs.

4. The CPU socket as claimed in claim 3, wherein each contacting tab further has a solder ball attached to the bottom end of the contacting tab.

* * * * *